(12) United States Patent
Wieber et al.

(10) Patent No.: US 8,969,610 B2
(45) Date of Patent: Mar. 3, 2015

(54) METHOD FOR OLIGOMERIZING HYDRIDOSILANES, THE OLIGOMERS THAT CAN BE PRODUCED BY MEANS OF THE METHOD, AND THE USE THEREOF

(75) Inventors: Stephan Wieber, Karlsruhe (DE); Matthias Patz, Bottrop (DE); Bernhard Stuetzel, Marl (DE); Michael Coelle, Haltern am See (DE); Nicole Brausch, Essen (DE); Janette Klatt, Recklinghausen (DE); Jutta Hessing, Dorsten (DE)

(73) Assignee: Evonik Degussa GmbH, Essen (DE)

( * ) Notice: Subject to any disclaimer, the term of this patent is extended or adjusted under 35 U.S.C. 154(b) by 373 days.

(21) Appl. No.: 13/574,376

(22) PCT Filed: Feb. 16, 2011

(86) PCT No.: PCT/EP2011/052256
§ 371 (c)(1),
(2), (4) Date: Jul. 20, 2012

(87) PCT Pub. No.: WO2011/104147
PCT Pub. Date: Sep. 1, 2011

(65) Prior Publication Data
US 2012/0291665 A1    Nov. 22, 2012

(30) Foreign Application Priority Data
Feb. 26, 2010 (DE) .......... 10 2010 002 405

(51) Int. Cl.
C07F 7/02  (2006.01)
C08G 77/60  (2006.01)
C09D 183/16  (2006.01)
H01L 21/02  (2006.01)

(52) U.S. Cl.
CPC .............. *C08G 77/60* (2013.01); *C09D 183/16* (2013.01); *H01L 21/02422* (2013.01); *H01L 21/02532* (2013.01); *H01L 21/02628* (2013.01)
USPC ...................................................... 556/400

(58) Field of Classification Search
CPC ............................ C07F 7/02; C07F 7/1836
USPC ......................................................... 556/400
See application file for complete search history.

(56) References Cited

U.S. PATENT DOCUMENTS

| | | | |
|---|---|---|---|
| 4,950,373 A | 8/1990 | Sundermeyer et al. | |
| 5,700,400 A | 12/1997 | Ikai et al. | |
| 6,027,705 A * | 2/2000 | Kitsuno et al. | ........ 423/347 |
| 2003/0229190 A1 | 12/2003 | Aoki et al. | |
| 2006/0222583 A1 | 10/2006 | Hazeltine | |
| 2007/0190265 A1 | 8/2007 | Aoki et al. | |
| 2011/0189072 A1 | 8/2011 | Brausch et al. | |
| 2011/0268642 A1 | 11/2011 | Brausch et al. | |
| 2012/0042951 A1 | 2/2012 | Stuetzel et al. | |
| 2012/0199832 A1 | 8/2012 | Stuetzel et al. | |
| 2012/0205654 A1 | 8/2012 | Stuetzel et al. | |
| 2013/0168824 A1 | 7/2013 | Wieber et al. | |

FOREIGN PATENT DOCUMENTS

| | | |
|---|---|---|
| CN | 1705767 A | 12/2005 |
| EP | 1 357 154 | 10/2003 |
| JP | 61106411 A | 5/1986 |
| WO | WO 2004/036631 A2 | 4/2004 |
| WO | 2010/003729 A1 | 1/2010 |

OTHER PUBLICATIONS

International Search Report Issued Aug. 3, 2011 in PCT/EP11/52256 Filed Feb. 16, 2011.
U.S. Appl. No. 13/498,206, filed Mar. 26, 2012, Brausch, et al.
U.S. Appl. No. 13/510,373, filed May 17, 2012, Wieber, et al.
U.S. Appl. No. 13/504,331, filed Apr. 26, 2012, Wieber, et al.
U.S. Appl. No. 13/989,823, filed May 28, 2013, Wieber, et al.
U.S. Appl. No. 13/824,641, filed Mar. 18, 2013, Wieber, et al.
U.S. Appl. No. 13/991,261, filed Jun. 3, 2013, Stenner, et al.
U.S. Appl. No. 13/885,316, filed May 14, 2013, Stenner, et al.
U.S. Appl. No. 13/991,986, filed Jun. 6, 2013, Brausch, et al.
U.S. Appl. No. 13/807,852, filed Dec. 31, 2012, Stuetzel, et al.

* cited by examiner

*Primary Examiner* — Sudhakar Katakam
*Assistant Examiner* — Kofi Adzamli
(74) *Attorney, Agent, or Firm* — Oblon, McClelland, Maier & Neustadt, L.L.P.

(57) ABSTRACT

The present invention relates to a method for oligomerizing hydridosilanes, wherein a composition comprising substantially at least one non-cyclic hydridosilane having a maximum of 20 silicon atoms as the hydridosilane is thermally converted at temperatures below 235° C. in the absence of a catalyst, the oligomers that can be produced according to the method, and the use thereof.

15 Claims, No Drawings

METHOD FOR OLIGOMERIZING HYDRIDOSILANES, THE OLIGOMERS THAT CAN BE PRODUCED BY MEANS OF THE METHOD, AND THE USE THEREOF

The present invention relates to a process for oligomerizing hydridosilanes, to the oligomers preparable by the process and to the use thereof.

Hydridosilanes and oligomers thereof are described in the literature as possible reactants for the production of silicon layers.

Hydridosilanes are understood to mean compounds which contain essentially only silicon and hydrogen atoms and which have fewer than 20 silicon atoms. Hydridosilanes may in principle be gaseous, liquid or solid and are—especially in the case of solids—essentially soluble in solvents such as toluene or cyclohexane, or in liquid silanes such as cyclopentasilane. Examples include monosilane, disilane, trisilane, cyclopentasilane and neopentasilane. Hydridosilanes having at least three or four silicon atoms may have a linear, branched or (optionally bi-/poly-)cyclic structure with Si—H bonds, and can preferably be described by the particular generic formulae $Si_nH_{2n+2}$ (linear or branched; where n=2-20), $Si_nH_{2n}$ (cyclic; where n=3-20) or $Si_nH_{2(n-i)}$ bi- or polycyclic; n=4-20; i={number of cycles}−1).

Even though it is possible in principle to use many hydridosilanes for silicon layer production, it has been found that only higher hydridosilanes i.e. hydridosilanes having more than 10 silicon atoms, can give good coverage of the surface of customary substrates in the case of coating thereof, and lead to homogeneous layers with few defects. For this reason, processes for preparing higher hydridosilanes are of interest. Many higher hydridosilanes can be prepared by oligomerizing lower hydridosilanes. In the case of such oligomerization of lower hydridosilanes, viewed in a formal sense, a higher hydridosilane molecule is formed from two lower hydridosilane molecules after abstraction of hydrogen and/or relatively small hydridosilyl radicals.

For example, DE 21 39 155 A1 describes a process for preparing hydridosilanes by pyrolysis of trisilane, n-tetrasilane and/or n-pentasilane. This process, however, requires a high level of technical complexity since the reaction involves firstly vapourizing the starting silane under high vacuum, followed by pyrolysis over a glass wool catalyst, and then the decomposition products have to be condensed and separated by gas chromatography.

EP 0 630 933 A2 describes a process for forming a condensate which can be converted thermally to a semiconductive material. The condensate is prepared via a dehydropolymerization reaction of a hydridosilane monomer based on monomers selected from monosilane, disilane and trisilane in the presence of a catalyst comprising at least one metal and/or a metal compound. However, a disadvantage of this preparation process is that the catalyst used has to be removed in a costly and inconvenient manner after the reaction has ended.

U.S. Pat. No. 5,252,766 A also describes catalyst-supported hydridosilane syntheses, namely a process which comprises the conversion of a hydridosilane compound in the presence of a lanthanoid complex. However, a disadvantage here too is that the catalyst used has to be removed in a costly and inconvenient manner after the reaction has ended. Moreover, the preparation of the corresponding catalyst systems is costly and inconvenient.

EP 1 134 224 A2 describes a composition for producing a silicon film comprising cyclopentasilane and silylcyclopentasilane. It is also stated there that silylcyclopentasilane can be used as a free-radical polymerization initiator for cyclopentasilane. It is thus possible to use a mixture containing the cyclic silanes cyclopentasilane and silylcyclopentasilane to prepare silane oligomers. These silane oligomers can be applied to a substrate as a polysilane coating film and converted thermally or optically to silicon. In the case of ring-opening polymerization of cyclic compounds, the preparation of silane oligomers forms essentially linear oligomers. These essentially linear oligomers are, however, disadvantageous for silicon layer production, since they can be used only in a very narrow molar mass range: too small a molecular weight leads to poor wetting, if any. Too great a molecular weight leads to unstable compositions from which excessively large oligomers precipitate, and with which it is not possible to obtain good wetting or homogeneous layers.

JP 2004-134440 A describes processes for producing silicon films on substrates, in which reaction mixtures comprising cyclic hydridosilanes and optionally linear hydridosilanes are first treated with heat and/or light, then applied to a substrate, and can finally be converted to a silicon layer by means of an exposure process. This process too has the disadvantage already mentioned, that oligomers based on cyclic compounds are disadvantageous. In addition, irradiation of the hydridosilanes is disadvantageous since the conversion of hydridosilanes requires high radiation intensities, and the conversion under irradiation does not have good controllability.

U.S. Pat. No. 6,027,705 A describes a multistage process for preparing trisilanes or higher silanes from mono- or disilane. A condensate originating from a conversion of mono- or disilane in a first reaction stage can be used in a second reaction zone, in a thermal process at temperatures of 250-450° C., to give a mixture of higher silanes. However, a problem here is that only a low proportion of silanes with a high molecular weight can be achieved at these temperatures; in addition to the mono- or disilane reactants, essentially silanes having 3 to 7 silicon atoms are predominant in the product mixture. This effect is particularly pronounced for a gaseous reaction regime.

It thus an object of the present invention to avoid the described disadvantages of the prior art. More particularly, it is an object of the present invention to provide a process with which oligomers with better usability for silicon layer production or mixtures thereof to provide in higher yield from hydridosilanes in a simpler manner, more particularly with a lower level of technical complexity and without the requirement for catalyst removal.

The object is surprisingly achieved by a process for oligomerizing hydridosilanes, in which a composition comprising, as the hydridosilane, essentially at least one noncyclic hydridosilane having a maximum of 20 silicon atoms in the absence of a catalyst is converted thermally at temperatures of less than 235° C.

As already stated above, a process for oligomerizing hydridosilanes is understood to mean a process in which, viewed in a formal sense, a hydridosilane molecule with a greater molecular weight is formed from two hydridosilane molecules after abstraction of hydrogen and/or relatively small hydridosilyl radicals.

Particularly good yields are achieved when the process according to the invention is a liquid phase process, i.e. a process in which the thermal conversion is performed in the absence of a catalyst in the liquid phase.

Preference is given to performing the process for oligomerization without supply of electromagnetic radiation, especially without UV radiation.

Noncyclic hydridosilanes having a maximum of 20 silicon atoms are compounds which satisfy the generic formula $Si_nH_{2n+2}$ where $n \leq 20$. Hydridosilanes usable with preference are hydridosilanes of the generic formula $Si_nH_{2n+2}$ where $n=3-20$, which are liquid or solid under standard conditions and thus give the advantage of being usable in liquid form or dissolved in a suitable solvent in a liquid phase process.

Compositions which comprise the at least one hydridosilane and are usable with preference contain hydridosilane mixtures with a weight-average molecular weight $M_w$ of $\leq 500$ g/mol. More preferably, the composition contains a hydridosilane mixture with a weight-average molecular weight $M_w$ of $\leq 400$ g/mol, even more preferably $M_w \leq 350$ g/mol. These hydridosilane mixtures have the advantages both of having easy preparability and particularly good solubility.

Compositions usable with preference are preparable via a process for preparing hydridosilanes from halosilanes, with which hydridosilanes, especially neopentasilane, can be prepared from halosilanes rapidly and in a higher yield than known in the prior art, without formation of by-products which are difficult to remove. In this process, a) i) at least one halosilane of the generic formula $Si_nX_{2n+2}$ (where $n \geq 3$ and X=F, Cl, Br and/or I) and
ii) at least one catalyst of the generic formula $NRR'_aR''_bY_c$ where a=0 or 1, b=0 or 1 and c=0 or 1, and

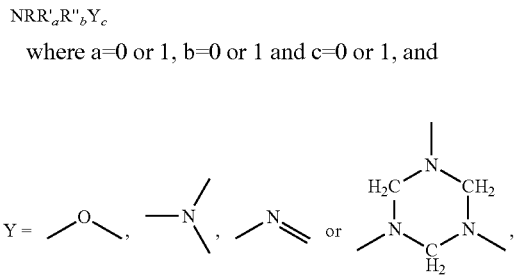

where aa) —R, R' and/or R" are each —$C_1$-$C_{12}$-alkyl, —$C_1$-$C_{12}$-aryl, —$C_1$-$C_{12}$-aralkyl, —$C_1$-$C_{12}$-aminoalkyl, —$C_1$-$C_{12}$-aminoaryl, —$C_1$-$C_{12}$-aminoaralkyl, especially preferably -Ph, -PhCH$_3$, -PhC$_2$H$_5$, -PhC$_3$H$_7$, —CH$_2$(C$_6$H$_4$)CH$_3$, —CH$_2$(C$_6$H$_4$)C$_2$H$_5$, —C$_2$H$_4$(C$_6$H$_4$)C$_2$H$_5$, —C$_2$H$_4$(C$_6$H$_4$)C$_3$H$_7$, —C$_3$H$_6$ (C$_6$H$_4$)C$_3$H$_7$, —C$_6$H$_2$(CH$_3$)$_3$, —C$_6$H$_3$(CH$_3$)$_2$, —C$_8$H$_7$, —C$_8$H$_6$CH$_3$, -PhNR'''R'''', -PhCH$_2$NR'''R'''', -PhC$_2$H$_4$NR'''R'''', -PhC$_3$H$_6$NR'''R'''', CH$_2$(C$_6$H$_4$)CH$_2$NR'''R'''', —CH$_2$(C$_6$H$_4$) C$_2$H$_4$—NR'''R'''', —C$_2$H$_4$(C$_6$H$_4$)C$_2$H$_4$NR'''R'''', —C$_2$H$_4$(C$_6$H$_4$)C$_3$H$_6$NR'''R'''', —C$_3$H$_6$(C$_6$H$_4$)C$_3$H$_6$NR'''R'''', —CH$_2$NR'''R'''', —C$_2$H$_4$NR'''R'''', —C$_3$H$_6$NR'''R'''', —C$_4$H$_8$NR'''R'''', —C$_5$H$_{10}$NR'''R'''', —C$_6$H$_{12}$NR'''R'''', —C$_7$H$_{14}$NR'''R'''', —C$_8$H$_{16}$NR'''R'''', —C$_9$H$_{18}$NR'''R'''' and/or —C$_{10}$H$_{20}$NR'''R'''' (where R''' and R''''=$C_1$-$C_{10}$-alkyl, —$C_1$-$C_{10}$-aryl and/or —$C_1$-$C_{10}$-aralkyl), and/or two or three R, R' and R" radicals, in the case that c=0, together form a cyclic or bicyclic, heteroaliphatic or heteroaromatic system including N, more particularly, the cyclic or bicyclic, heteroaliphatic or heteroaromatic system is preferably a pyrrolidine, pyrrole, piperidine, pyridine, hexamethyleneimine, azatropylidene or a quinoline ring system, with the proviso that at least one R, R' or R" radical is not —CH$_3$ and/or bb) —R and R' and/or R" (in the case that c=1) are —$C_1$-$C_{12}$-alkylene, —$C_1$-$C_{12}$-arylene, —$C_1$-$C_{12}$-aralkylene, —$C_1$-$C_{12}$-heteroalkylene, —$C_1$-$C_{12}$-heteroarylene, —$C_1$-$C_{12}$-heteroaralkylene and/or —N=, especially preferably —CH$_2$—, —C$_2$H$_4$—, —C$_3$H$_6$, —C$_4$H$_8$—, —C$_6$H$_{10}$—, —C$_6$H$_{12}$—, —C$_7$H$_{14}$—, —C$_8$H$_{16}$—, —C$_9$H$_{18}$—, —C$_{10}$H$_{20}$—, -Ph-, -PhCH$_2$—, -PhC$_2$H$_4$—, -PhC$_3$H$_6$—, —CH$_2$ (C$_6$H$_4$)CH$_2$—, —CH$_2$(C$_6$H$_4$)C$_2$H$_4$—, —C$_2$H$_4$ (C$_6$H$_4$)C$_2$H$_4$—, —C$_2$H$_4$(C$_6$H$_4$)C$_3$H$_6$—, C$_3$H$_6$ (C$_6$H$_4$)C$_3$H$_6$—, C$_6$H(CH$_3$)$_3$—, —C$_6$H$_2$(CH$_3$)$_2$—, —CH=, —CH=CH—, —N=, —N=CH— and/or —CH=N—, or cc)—(in the case that a=b=c=0) R=C—R''' (where R'''=—$C_1$-$C_{10}$-alkyl, —$C_1$-$C_{10}$-aryl and/or —$C_1$-$C_{10}$-aralkyl), are converted to form a mixture comprising at least one halosilane of the generic formula $Si_nX_{2m+2}$ (where m>n and X=F, Cl, Br and/or I) and $SiX_4$ (where X=F, Cl, Br and/or I), and b) the at least one halosilane of the generic formula $Si_mX_{2m+2}$ is hydrogenated to form a hydridosilane of the generic formula $Si_mH_{2m+2}$.

Most preferably, the composition comprising, as the hydridosilane, essentially at least one noncyclic hydridosilane having a maximum of 20 silicon atoms is a composition comprising, as the hydridosilane, essentially neopentasilane.

Likewise preferably, the composition used may be a reaction mixture (containing essentially hydridosilanes having 3 to 20 silicon atoms) originating from a dehydropolymerization reaction of lower hydridosilanes (especially monosilane, disilane, trisilane) to higher hydridosilanes. Corresponding compositions can be obtained under homogeneous or heterogeneous catalysis from lower hydridosilanes.

A preferred reaction mixture originating from a heterogeneous synthesis operation is preparable via a process for preparing higher hydridosilanes, in which at least one lower hydridosilane and at least one heterogeneous catalyst are reacted, said at least one catalyst comprising Cu, Ni, Cr and/or Co applied to a support and/or oxide of Cu, Ni, Cr and/or Co applied to a support.

A preferred reaction mixture originating from a homogeneous synthesis operation is preparable via a process for preparing higher hydridosilanes of the general formula H—(SiH$_2$)$_n$—H where $n \geq 2$, in which one or more lower hydridosilanes (especially monosilane), hydrogen and one or more transition metal compounds comprising elements of transition group VIII of the Periodic Table and of lanthanoids are reacted at a pressure of more than 5 bar absolute, then the system is decompressed and the higher hydridosilanes are removed from the reaction mixture obtained.

As already stated, in the process according to the invention for oligomerizing hydridosilanes, compositions are used which comprise essentially at least one noncyclic hydridosilane with a maximum of 20 silicon atoms. A composition comprising, as the hydridosilane, essentially at least one noncyclic hydridosilane is understood to mean a composition which has, as the primary oligomer former, at least one noncyclic hydridosilane. In addition, the composition may also comprise, in small proportions, cyclic and cage-type hydridosilanes, especially those of the generic formulae $Si_nH_{2n}$ (cyclic; where n=3-20) or $Si_nH_{2(n-i)}$ (bi- or polycyclic; n=4-20; i={number of cycles}−1). To achieve particularly good effects, the proportion thereof, however, should not be more than 5% by weight, preferably not more than 2% by weight, based on the total mass of hydridosilane. Very particular preference is given, since the resulting oligomers are very particularly suitable for silicon layer formation, to the use of compositions comprising, as the hydridosilane, exclusively noncyclic hydridosilanes having a maximum of 20 silicon atoms, which means that the compositions do not contain any cyclic (including cage-type) hydridosilanes.

The composition may in principle consist exclusively of hydridosilanes or have further constituents. However, the composition preferably has further constituents, especially solvents, dopants or further additives.

The composition preferably has at least one solvent. Solvents usable advantageously may be selected from the group consisting of linear, branched and cyclic, saturated, unsaturated and aromatic hydrocarbons having one to 12 carbon atoms (optionally partially or fully halogenated), alcohols, ethers, carboxylic acids, esters, nitriles, amines, amides, sulphoxides and water. Particular preference is given to n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydro-naphthalene, diethyl ether, dipropyl ether, ethylene glycol dimethyl ether, ethylene glycol diethyl ether, ethylene glycol methyl ethyl ether, diethylene glyol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform. Solvents with particularly good usability are the hydrocarbons n-pentane, n-hexane, n-hexane, n-octane, n-decane, dodecane, cyclohexane, cyclooctane, cyclodecane, benzene, toluene, m-xylene, p-xylene, mesitylene, indane and indene.

To achieve particularly good results, the composition contains the solvent(s) preferably in proportions of 20-80% by weight based on the total mass of the composition.

In addition, the composition may have at least one dopant. A dopant is understood to mean an elemental polymorph or an element compound of a semimetal of main group III or V of the Periodic Table which is capable of reacting with hydridosilanes with incorporation of at least the semimetal of main group III or V to form a semimetal-containing oligomer. Corresponding semimetal-containing oligomers are preferentially suitable for production of doped silicon layers. Dopants usable with preference may be selected from the group consisting of boron compounds of the $BH_xR_{3-x}$ type (where $x=0-3$ and $R=C_1-C_{10}$-alkyl radical, unsaturated cyclic, optionally ether- or amino-complexed $C_2-C_{10}$-alkyl radical), compounds of the formulae $Si_5H_9BR_2$ (R=H, Ph, $C_1-C_{10}$-alkyl radical) and $Si_4H_9BR_2$ (R=H, Ph, $C_1-C_{10}$-alkyl radical), red phosphorus, white phosphorus ($P_4$), compounds of the formula $PH_xR_{3-x}$, (where $x=0-3$ and $R=Ph$, $SiMe_3$, $C_1-C_{10}$-alkyl radical), and compounds of the formulae $P_7(SiR_3)_3$ (R=H, Ph, $C_1-C_{10}$-alkyl radical), $Si_5H_9PR_2$ (R=H, Ph, $C_1-C_{10}$-alkyl radical) and $Si_4H_9PR_2$ (R=H, Ph, $C_1-C_{10}$-alkyl radical).

To achieve particularly good results, the composition contains the dopant(s) preferably in proportions of 0.01-20% by weight based on the total mass of the composition.

The dopant may additionally be present in the hydridosilane-containing composition not only already on commencement of reaction, but it may also be added only in the course of reaction or thereafter, but preferably during the course of reaction.

The composition may also have preferably at least one additive. The additives used may preferably be wetting agents and nonionic surface additives (especially fluorine-based surface additives with fluorinated or perfluorinated alkyl groups or polyether alkyl group-based surface additives with oxyalkyl groups). Additives usable particularly advantageously may be selected from the group consisting of fluorine-based surface additives with fluorinated or perfluorinated alkyl groups.

To achieve particularly good results, the composition contains the additive(s) preferably in proportions of 0.001-20% by weight based on the total mass of the composition.

The process according to the invention is performed in the absence of a catalyst. Thus, the synthesis is effected without the presence of an agent which catalyses the conversion of the noncyclic hydridosilane with not more than 20 silicon atoms to oligomers. When reaction mixtures which originate from a catalyst-supported synthesis of noncyclic hydridosilanes with not more than 20 silicon atoms from smaller hydridosilanes are used, from which it has not been possible to remove the catalyst used in the preceding stage without residue, the reaction mixture may also contain up to a maximum of 10 ppm of this catalyst. However, the composition is preferably catalyst-free, which means that it has a value of 0.1 ppm which is below the detection limit.

The process according to the invention is performed thermally at temperatures of less than 235° C. Preferably, the process is performed between temperatures in the range from 30 to 235° C. More preferably, the process, to achieve particularly good yields, is performed at temperatures in the range from 70 to 220° C., even more preferably between temperatures in the range from 90 to 210° C. Corresponding temperatures can be established by means known to those skilled in the art.

For the process according to the invention, the pressure is in principle not critical. According to the temperature, the pressure, however, should preferably be selected such that the process can be performed in the liquid phase. More preferred pressures are in the range from 800 mbar to 200 bar.

Preferred residence times of the composition in the reactor are in the range from one minute to 10 hours.

More preferably, the composition is stirred during the thermal conversion.

More preferably, a solvent can be added to the composition during or after the completion of the thermal reaction. The resulting advantage is to influence the mean molecular weight distribution and to prevent formation of high oligomeric H-silanes which precipitate as particles or are present in colloidal form in the composition, and can later adversely affect Si layer formation.

The invention further provides the hydridosilane oligomers preparable by the process according to the invention. These typically have weight-average molecular weights of 290 to 5000 g/mol. It is possible in a particularly efficient manner by the process according to the invention to prepare oligomers with a weight-average molecular weight of 500-3500 g/mol.

The hydridosilane oligomers preparable in accordance with the invention are suitable for a multitude of uses. They are particularly suitable—alone or in compositions with further constituents—for production of electronic or optoelectronic component layers. The invention thus also provides for the use of the hydridosilane oligomers obtainable by the process according to the invention for production of optoelectronic or electronic component layers. The hydridosilane oligomers obtainable by the process according to the invention are preferentially suitable for production of charge-transporting components in optoelectronic or electronic components. The hydridosilane oligomers obtainable by the process according to the invention are also suitable for production of silicon-containing layers, preferably of elemental silicon layers.

The subject-matter of the present invention is illustrated further in a nonlimiting manner by the examples which follow.

EXAMPLE 1

0.5 ml of neopentasilane is heated in a glass vessel at 280° C. on a hotplate. The liquid begins to boil immediately and, after approx. 10 min, only a yellow solid remains, which is unsuitable for silicon production.

EXAMPLE 2

0.5 ml of neopentasilane is heated in a glass vessel at 30° C. for 5 h on a hotplate. The weight-average molecular weight of the mixture obtained, determined from GPC measurements, is 230 g/mol.

EXAMPLE 3

0.5 ml of neopentasilane is heated in a glass vessel at 150° C. for 5 h on a hotplate. The weight-average molecular weight of the oligomer mixture obtained, determined from GPC measurements, is 3330 g/mol.

EXAMPLE 4

4 drops of a formulation composed of 0.05 ml of oligomerited H-silane from Example 3 and 0.05 ml of neopentasilane in 0.25 ml of cyclooctane are dropped onto a glass substrate, followed by spin-coating at 6000 rpm. This gives a film, which is subsequently converted to a Si layer at 400° C. for 10 min. The Si layer obtained is approx. 62 nm thick and has a roughness Rq of approx. 3.3 nm and a waviness Wt of approx. 3.9 nm.

The invention claimed is:

1. A process for oligomerizing a hydridosilane, the process comprising:
thermally converting, in the absence of a catalyst, a composition comprising a noncyclic hydridosilane comprising a maximum of 20 silicon atoms at a temperature of less than 235° C.

2. The process of claim 1, being a liquid phase process.

3. The process of claim 1, wherein the composition comprises a hydridosilane mixture having a weight-average molecular weight, $M_w$, of ≤500 g/mol.

4. The process of claim 1, further comprising, prior to the thermal conversion:
(A) converting a first mixture comprising: i) a halosilane having formula $Si_nX_{2n+2}$, wherein n≥3, and X is at least one selected from the group consisting of F, Cl, Br, and I; and ii) a catalyst having formula:

$$NRR'_aR'_bY_c,$$

wherein:
a=0 or 1, b=0 or 1 and c=0 or 1; and

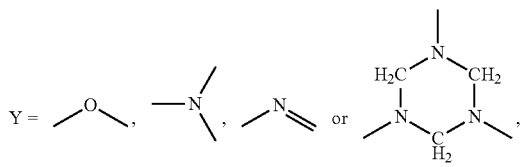

where
aa)—at least one selected from the group consisting of R, R', and R" is a —$C_1$-$C_{12}$-alkyl, a —$C_1$-$C_{12}$-aryl, a —$C_1$-$C_{12}$-aralkyl, a —$C_1$-$C_{12}$-aminoalkyl, a —$C_1$-$C_{12}$-aminoaryl, a —$C_1$-$C_{12}$-aminoaralkyl,
and/or
two or three R, R', and R" radicals, in the case that c=0, together form a cyclic or bicyclic, heteroaliphatic or heteroaromatic system comprising N,
with the proviso that at least one of the R, R', or R" radical is not —$CH_3$, and/or
bb) at least one selected from the group consisting of (i) R and R' and (ii) R" (in the case that c=1) is a —$C_1$-$C_{12}$-alkylene, a —$C_1$-$C_{12}$-arylene, a —$C_1$-$C_{12}$-aralkylene, a —$C_1$-$C_{12}$-heteroalkylene, a —$C_1$-$C_{12}$-heteroarylene, a —$C_1$-$C_{12}$-heteroaralkylene, —N═, or any mixture thereof,
or
cc) in the case that a=b=c=0, R═══C—R''', wherein R'''=a —$C_1$-$C_{10}$-alkyl, a —$C_1$-$C_{10}$-aryl, a —$C_1$-$C_{10}$-aralkyl, or any mixture thereof, to form a second mixture comprising a halosilane of formula $Si_mX_{2m+2}$, wherein m>n and X is at least one selected from the group consisting of F, Cl, Br, and I; and $SiX_4$ wherein X is at least one selected from the group consisting of F, Cl, Br, and I; and then
(B) hydrogenating the halosilane of formula $Si_mX_{2m+2}$, to form a hydridosilane of having formula $Si_mH_{2m+2}$.

5. The process of claim 1, wherein the composition comprises neopentasilane.

6. The process of claim 1, wherein the composition further comprises at least one solvent selected from the group consisting of a linear, branched and cyclic, saturated, unsaturated and aromatic hydrocarbon comprising 1 to 12 carbon atoms, an alcohol, an ether, a carboxylic acid, an ester, a nitrile, an amine, an amide, a sulphoxide, and water.

7. The process of claim 1, wherein the composition further comprises 20-80% by weight of a solvent, based on a total mass of the composition.

8. The process of claim 1, wherein the composition further comprises at least one dopant selected from the group consisting of:
$BH_xR_{3-x}$, wherein x=0-3 and R=a $C_1$-$C_{10}$-alkyl radical, unsaturated cyclic, optionally ether- or amino-complexed $C_2$-$C_{10}$-alkyl radical;
$Si_5H_9BR_2$, wherein R═H, Ph, or a $C_1$-$C_{10}$-alkyl radical;
$Si_4H_9BR_2$, wherein R═H, Ph, or a $C_1$-$C_{10}$-alkyl radical;
red phosphorus;
white phosphorus ($P_4$);
$PH_xR_{3-x}$, wherein x=0-3 and R=Ph, $SiMe_3$, or a $C_1$-$C_{10}$-alkyl radical;
$P_7(SiR_3)_3$, wherein R═H, Ph, or a $C_1$-$C_{10}$-alkyl radical;
$Si_5H_9PR_2$, wherein R═H, Ph, or a $C_1$-$C_{10}$-alkyl radical; and
$Si_4H_9PR_2$, wherein R═H, Ph, or a $C_1$-$C_{10}$-alkyl radical.

9. The process of claim 8, wherein a content of the dopant in the composition is from 0.01-20% by weight, based on total mass of the composition.

10. The process of claim 1, further comprising, during the thermal conversion or thereafter:
   adding a dopant to the composition, wherein the dopant is at least one selected from the group consisting of:
   $BH_xR_{3-x}$, wherein x=0-3 and R=a $C_1$-$C_{10}$-alkyl radical, unsaturated cyclic, optionally ether- or amino-complexed $C_2$-$C_{10}$-alkyl radical;
   $Si_5H_9BR_2$, wherein R=H, Ph, or a $C_1$-$C_{10}$-alkyl radical;
   $Si_4H_9BR_2$, wherein R=H, Ph, or a $C_1$-$C_{10}$-alkyl radical;
   red phosphorus;
   white phosphorus ($P_4$);
   $PH_xR_{3-x}$, wherein x=0-3 and R=Ph, $SiMe_3$, or a $C_1$-$C_{10}$-alkyl radical;
   $P_7(SiR_3)_3$, wherein R=H, Ph, or a $C_1$-$C_{10}$-alkyl radical;
   $Si_5H_9PR_2$, wherein R=H, Ph, or a $C_1$-$C_{10}$-alkyl radical; and
   $Si_4H_9PR_2$, wherein R=H, Ph, or a $C_1$-$C_{10}$-alkyl radical.

11. The process of claim 1, wherein the thermal conversion is performed at a temperature in the range from 70 to 220° C.

12. The process of claim 1, wherein the composition comprises a hydridosilane mixture having a weight-average molecular weight, $M_w$, of ≤400 g/mol.

13. The process of claim 1, wherein the composition comprises a hydridosilane mixture having a weight-average molecular weight, $M_w$, of ≤350 g/mol.

14. The process of claim 1, wherein the noncylic hydridosilane consist essentially of neopentasilane.

15. The process of claim 1, wherein the thermal conversion is performed at a temperature in the range from 90 to 210° C.

* * * * *